United States Patent [19]

Yang et al.

[11] Patent Number: 4,992,842
[45] Date of Patent: Feb. 12, 1991

[54] CHARGE-COUPLED DEVICE CHANNEL WITH COUNTINOUSLY GRADED BUILT-IN POTENTIAL

[75] Inventors: Kei-Wean C. Yang; John E. Taggart, both of Beaverton, Oreg.

[73] Assignee: Tektronix, Inc., Beaverton, Oreg.

[21] Appl. No.: 216,079

[22] Filed: Jul. 7, 1988

[51] Int. Cl.$^5$ .............. H01L 29/78; G11C 19/28
[52] U.S. Cl. .......................... 357/24; 377/58
[58] Field of Search ............ 357/24; 377/57–63

[56] References Cited

U.S. PATENT DOCUMENTS

| | | | |
|---|---|---|---|
| 3,760,202 | 9/1973 | Kosonocky | 357/24 |
| 3,767,983 | 10/1973 | Berglund | 357/24 |
| 3,796,932 | 3/1974 | Amelio et al. | 357/24 |
| 3,986,198 | 10/1976 | Kosonocky | 357/24 |
| 4,067,001 | 1/1978 | Hoffmann | 357/24 |
| 4,245,233 | 1/1981 | Lohstroh | 357/24 |
| 4,364,164 | 12/1982 | Bluzer et al. | 357/24 |

*Primary Examiner*—Gene M. Munson
*Attorney, Agent, or Firm*—Daniel J. Bedell; John Smith-Hill

[57] ABSTRACT

A charge-coupled device includes an array of closely spaced electrodes aligned along a lateral path on an oxide layer covering a semiconductor substrate. A portion of a channel reigon in the substate below each electrode has a tilted potential gradient providing an electrical field assisting lateral charge carrier drift within the channel region.

10 Claims, 7 Drawing Sheets

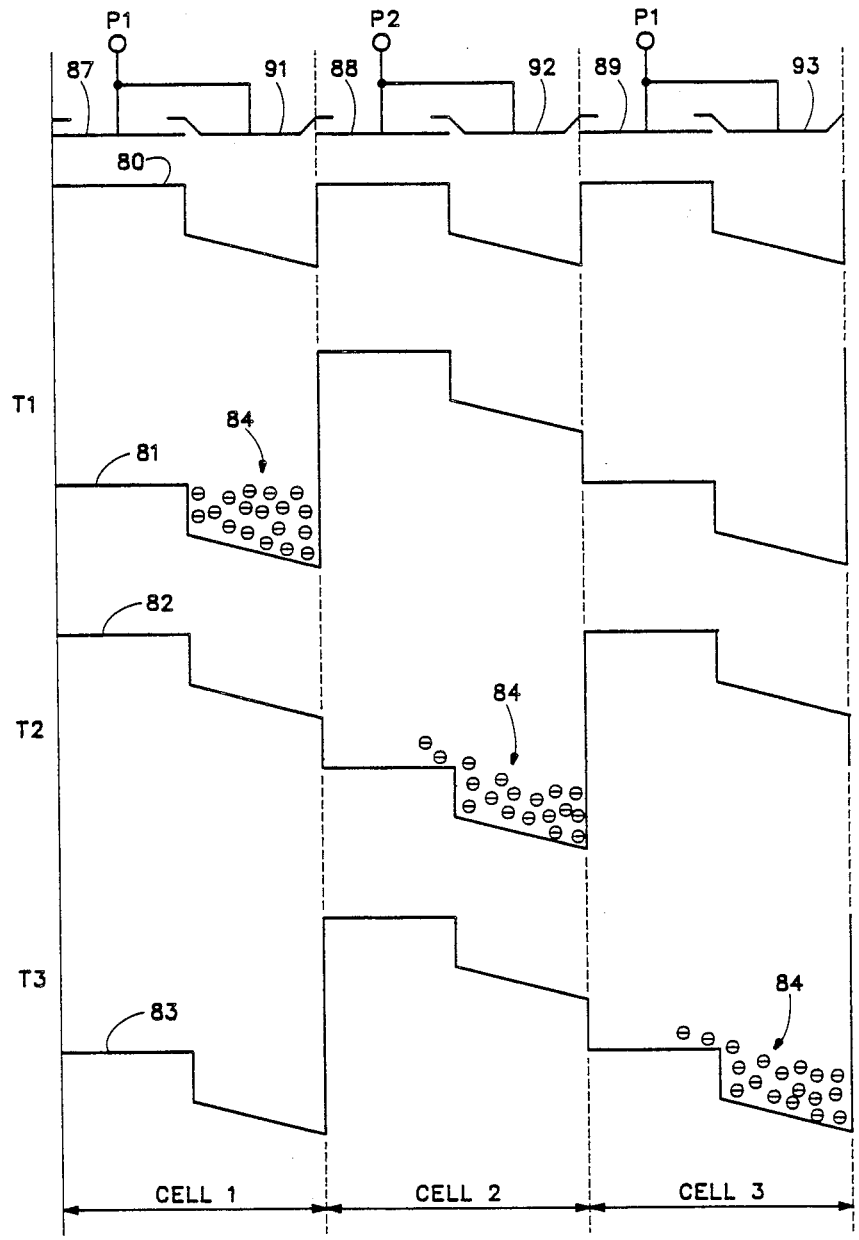

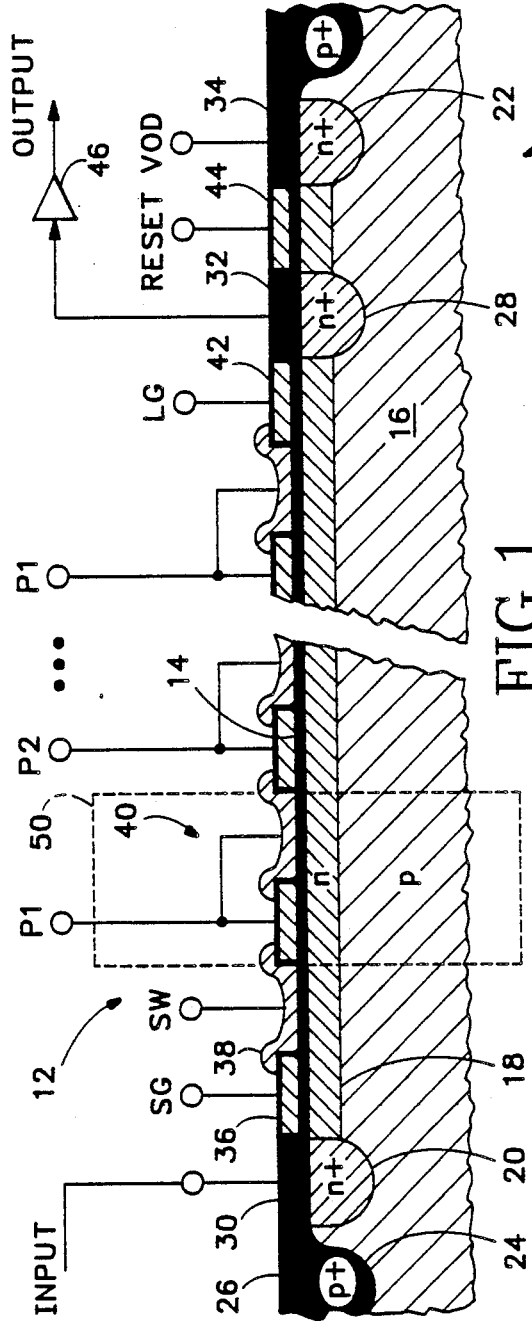
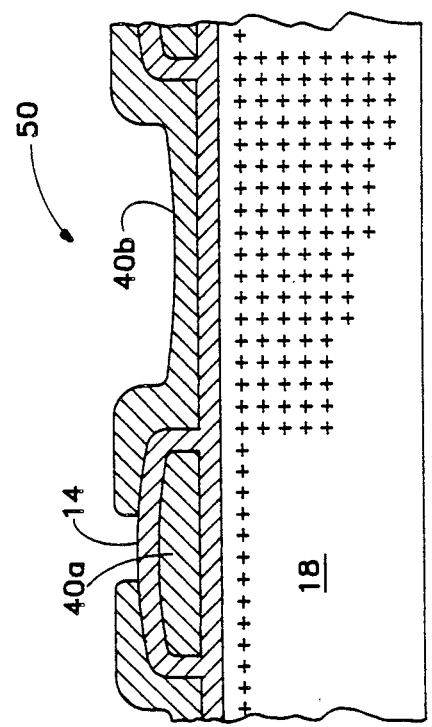
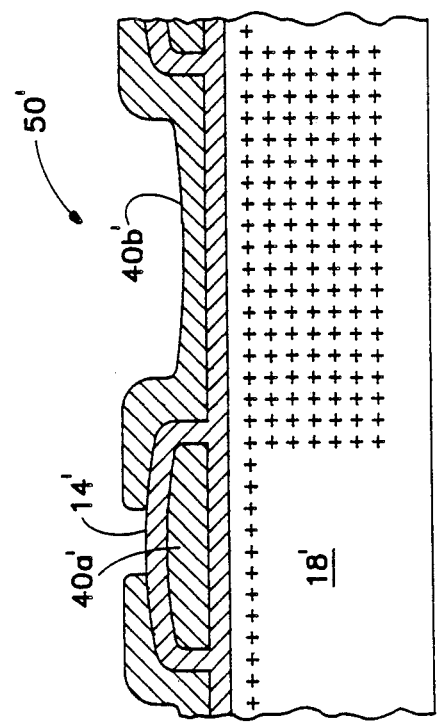
FIG. 1
FIG. 4
FIG. 2 (PRIOR ART)

CHARGE-COUPLED DEVICE CHANNEL WITH COUNTINOUSLY GRADED BUILT-IN POTENTIAL

CROSS-REFERENCES TO RELATED APPLICATION

The tilted channel charge-coupled device of the present invention is also described in copending U.S. patent application Ser. No. 215,967, filed July 7, 1988, entitled "Tilted Channel, Serial-Parallel-Serial Charge-Coupled Device", now U.S. Pat. No. 4,965,648.

BACKGROUND OF THE INVENTION

The present invention relates to charge-coupled devices and in particular to a charge-coupled device exhibiting a tilted channel potential in each cell thereof.

A charge-coupled device (CCD) includes an array of closely spaced cells aligned along a lateral path. Each cell includes an electrode formed on an oxide layer covering a semiconductor substrate with the substrate of each cell having a channel region for storing charge carriers. When electrodes of neighboring cells are biased by clock signals of differing phase, an electric field develops between channel regions within or on the surface of the substrate beneath the electrodes of the cells and this electric field drives charge carriers stored in the channel region of one cell into the channel region of its neighboring cell. By applying appropriately phased clock signals to electrodes of neighboring CCD cells, charges are shifted laterally from cell-to-cell.

During initial stages of charge transfer between adjacent CCD cells, the clock-induced potential gradient between the channel regions of the cells provides a strong electric field driving carriers quickly into the receiving cell. A high carrier concentration gradient between channel regions of the adjacent cells also encourages carrier flow by diffusion. However as charge carriers begin to accumulate in the receiving cell, both the carrier concentration gradient and the potential gradient between the channel regions of the adjacent cells decrease, thereby slowing diffusion and drift of remaining carriers into the channel region of the receiving cell. As the frequency of clock signals applied to the electrodes of CCD cells increases, the time available for all charge carriers to move from one cell to its neighboring cell decreases. At high clock frequencies, a substantial portion of the charge remains behind at the end of a transfer cycle.

The "charge transfer efficiency" of a charge-coupled device is the ratio of charge transferred to a cell from its neighboring cell during a clock phase to the initial charge stored under its neighbor electrode at the beginning of the clock phase. As the frequency of operation of a charge-coupled device increases, charge transfer efficiency decreases. A high charge transfer efficiency is desirable, particularly in large charge-coupled devices, to prevent substantial degradation of charges passing through the charge-coupled device. Charge transfer efficiency of a charge-coupled device can limit its frequency of operation.

SUMMARY OF THE INVENTION

A charge-coupled device (CCD) includes an array of laterally aligned CCD cells, each including an electrode formed above an oxide layer covering a semiconductor substrate. When electrodes of neighboring cells are biased by differently phased clock signals, a charge stored in a channel region of the substrate of one cell passes in a lateral direction into a channel region of its neighboring cell. In accordance with one aspect of the invention, the channel region in each CCD cell has a tilted potential gradient in the lateral direction providing an electrical field. The electrical field applies a lateral force on charge carriers within the channel region increasing the rate of charge carrier drift through the channel region. The drift rate increase is most apparent during the latter portion of a clock signal phase when carrier concentration and clock-induced potential gradients between channel regions of neighboring cells are reduced. The electrical field provided by the tilted potential gradient improves charge transfer efficiency, particularly at higher clock frequencies.

In accordance with another aspect of the invention, in a preferred embodiment thereof, the tilted potential gradient is a built-in potential gradient produced by non-uniformly doping of the channel of each cell in the lateral direction.

In accordance with a further aspect of the invention, in alternative embodiments, the tilted potential gradient may be produced by providing a laterally graded oxide layer thickness under each electrode, by providing electrodes having laterally graded work functions, or by providing laterally graded clock signal potentials on each electrode.

It is accordingly an object of the invention to provide an improved charge-coupled device having high charge transfer efficiency when operating at a high clock frequency.

The subject matter of the present invention is particularly pointed out and distinctly claimed in the concluding portion of this specification. However, both the organization and method of operation of the invention, together with further advantages and objects thereof, may best be understood by reference to the following description taken with the accompanying drawings wherein like reference characters refer to like elements.

BRIEF DESCRIPTION OF THE DRAWING

FIG. 1 is a sectional view of a two-phase charge-coupled device in accordance with the present invention;

FIG. 2 is a sectional view of a prior art single cell of a two-phase, charge-coupled device;

FIG. 4 is a sectional view of a single cell of a two-phase charge-coupled device having a graded channel dopant concentration in accordance with the present invention;

DESCRIPTION OF THE PREFERRED EMBODIMENT

Figure 15:
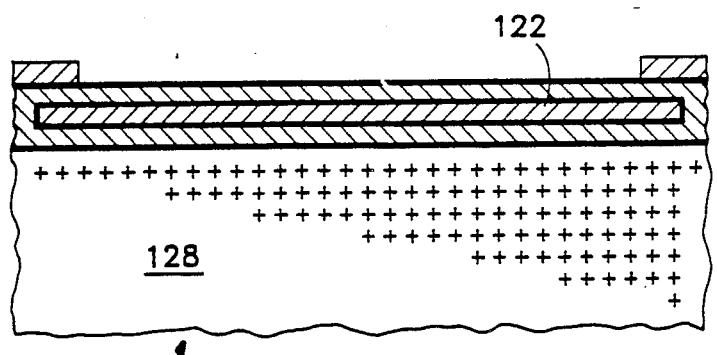
FIG. 15 is a sectional view of a single cell of a multiple phase charge-coupled device illustrating channel dopant concentration in accordance with the present invention.

Referring to FIG. 1, a two-phase, charge-coupled device (CCD) 10 comprises an array 12 of closely spaced polysilicon electrodes aligned along a lateral path on a silicon dioxide insulation layer 14 grown on the surface of a p-type silicon semiconductor substrate 16. (FIG. 1 is exaggerated in vertical dimension in order to illustrate structural details Electrodes of array 12 are isolated one from another by extensions of insulation layer 14. A portion of substrate 16 under array 12 is doped to form an n-type channel region 18 between n+ input and output diffusion regions 20 and 22. Channel region 18 preferably provides a buried channel for conducting charge carriers in a lateral direction under the electrode array 12. However in alternative embodiments of the invention, channel region 18 may provide a surface channel. Charge-coupled device 10 is surrounded by a p+ guard ring diffusion region 24 covered by a field oxidation layer 26. An n+ floating diffusion region 28 intersects channel region 18 near the output diffusion region 22. Metallic contacts 30, 32, and 34 extend through insulation layer 14 to provide connections to diffusion regions 20, 28 and 22, respectively. The electrodes of array 12 include a "sample gate" electrode 36, a "sample well" electrode 38, a sequence of CCD cell electrode pairs 40, and a "last gate" electrode 42. An additional "reset" electrode 44 lies above the portion of channel region 18 between diffusion regions 28 and 22. Each CCD cell electrode pair 40, along with the portion of insulation layer 14 and substrate 16 therebelow, comprises a separate "cell" 50 of the charge-coupled device. Many such cells are included in the charge-coupled device.

Charge-coupled device 10 samples an input signal applied to contact 30 above input diffusion region 20 and stores a packet of charge in channel region 18 under sample gate electrode 36. The amount of stored charge is proportional to the voltage of the input signal. The charge packet thereafter shifts laterally from cell-to-cell through channel region 18 to floating diffusion region 28. Contact 32 above floating diffusion region 28 is suitably connected to an amplifier 46 producing an output voltage proportional to the charge in the floating diffusion region. The charge packet thereafter shifts from floating diffusion region 28 to output diffusion region 22 via the channel region 18 therebetween. Output diffusion region 22 is connected to a constant voltage source VOD that removes the charge packet from the output diffusion region. Sampling of the input signal applied to contact 30 and shifting of the resulting charge packet through channel region 18 to output diffusion region 22 are controlled in a well known manner by a set of phased clock signals SG, SW, P1, P2, LG and RESET. The SG, SW, LG and RESET clock signals are applied to electrodes 36, 38, 42 and 44 respectively. The P1 and P2 clock signals are applied to electrode pairs 40 of alternate CCD cells 50.

The present invention relates to an improved CCD cell 50. To simplify understanding of the invention, a typical two-phase CCD cell of the prior art is first described. As illustrated in FIG. 2., the prior art CCD cell 50' includes a polysilicon electrode pair 40a' and 40b' insulated from a doped n-type channel region 18' in a silicon substrate by a silicon dioxide insulation layer 14'. Although not shown in FIG. 2, electrodes 40a' and 40b' are interconnected for receiving the same clock signal P1 or P2. The "+" symbols in channel region 18' represent the relative dopant density in the channel in the direction of carrier flow. The dopant density in the channel region under each electrode 40a' and 40b' is uniform in the lateral direction, but the dopant density under electrode 40b' is much higher than the dopant density under electrode 40a'. The "stepped" channel dopant density causes a stepped built-in channel potential preventing charge carriers in the channel under electrode from flowing to the left.

Figure 3:
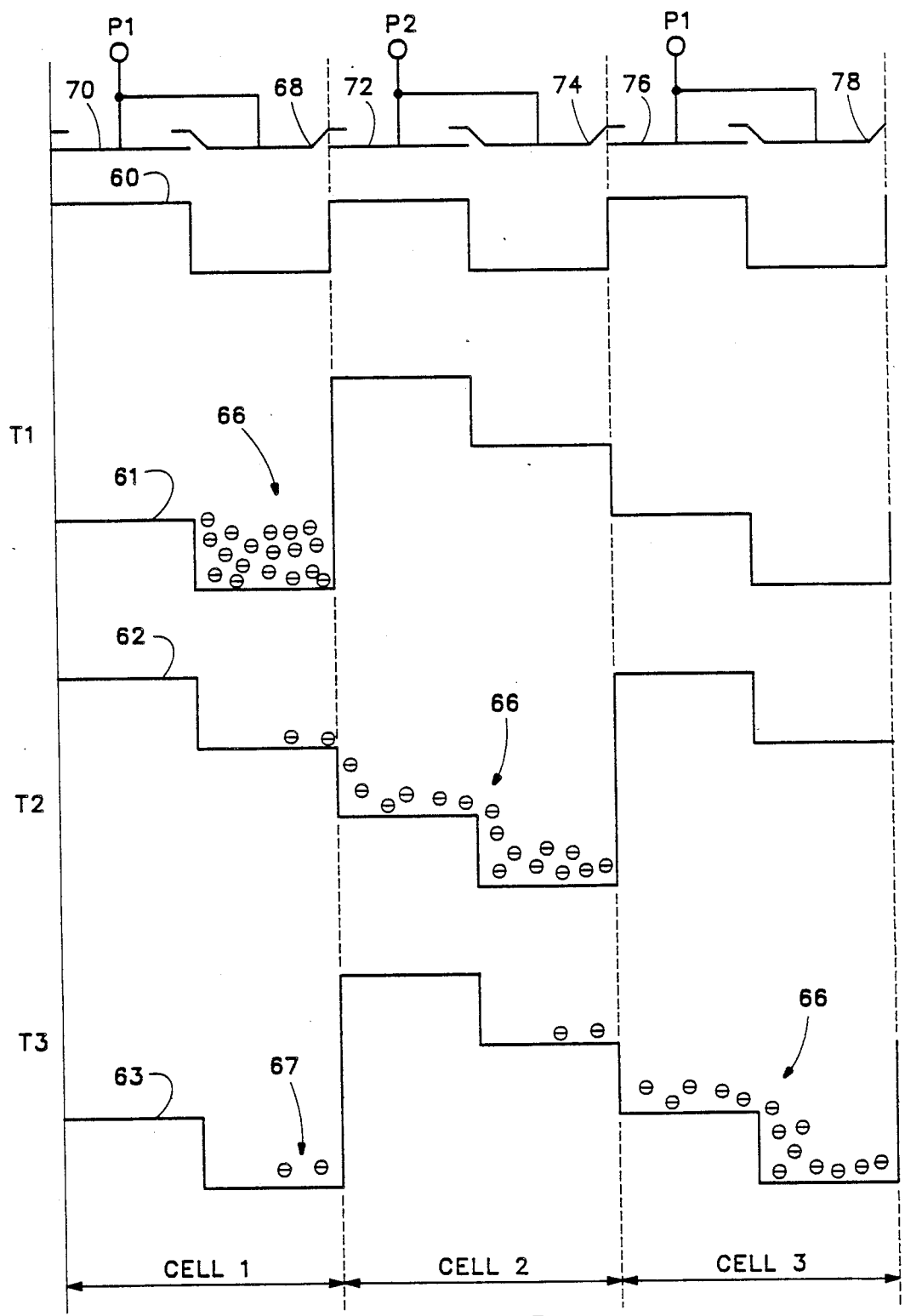
FIG. 3 is a diagram illustrating charge transfer in a two-phase, charge-coupled device including prior art CCD cells similar to the cell of FIG. 2.

FIG. 3 illustrates how charge carriers are shifted through three adjacent prior art CCD cells of FIG. 2. A simplified sectional view of the three cells (cells 1-3) is illustrated at the top of FIG. 3. In a two-phase charge-coupled device, clock signals P1 and P2, 180 degrees out of phase with one another, drive electrodes of adjacent cells in an alternating fashion. As illustrated in FIG. 3, clock signal P1 is applied to electrodes of cells 1 and 3 while clock signal P2 is applied to electrodes of cell 2. FIG. 3 includes a plot 60 of the built-in channel potential of each cell as a function of distance along the lateral path of carrier flow in the channel. The "built-in" channel potential is the relative potential of the channel when no clock signals are applied to the gates and no charge packets are stored at any point in the channel. As seen in FIG. 3, the built-in channel potential is constant and relatively high under one electrode of each cell (i.e., electrodes 70, 72 and 76) and constant but relatively low under the other electrode of each cell (electrodes 68, 74, and 78).

FIG. 3 also includes plots 61-63 of relative channel potential as a function of lateral distance along the channel at three different times T1-T3 during movement of a charge packet through the charge-coupled device. At time T1 clock signal P1 is asserted and clock signal P2 is deasserted. Clock signal P1 drives channel potentials across cells 1 and 3 below their built-in levels, while the channel potentials across cell 2 remain at their built-in levels. Cell 1 currently stores a packet of charge carriers 66 under electrode 68. The high potential gradient between areas of the channel under electrodes 70 and 68 of cell 1 and between the channel under electrode 72 of cell 2 and the channel under electrode 68 of cell 1 produce electric fields preventing carriers 66 from leaving the "potential well" under electrode 68.

Between times T1 and T2, clock signal P2 is asserted and clock signal P1 is deasserted. As clock signal P1 is deasserted the channel potentials of cells 1 and 3 rise back to their built-in levels. At the same time, clock signal P2 drives down channel potentials of cell 2. Carriers 66 drift and diffuse from the channel area under electrode 68 of cell 1 through the channel under electrode 72 of cell 2 and into the channel under electrode 74. At time T2, carriers are flowing from cell 1 to cell 2. Shortly after time T2, clock signals P1 and P2 again switch states, thereby driving channel potentials of cells 1 and 3 low while permitting channel potentials in cell 2 to rise. Thereafter the carriers drift and diffuse from cell 2 through the channel under electrode 76 of cell 3 and into the channel under electrode 78. FIG. 3 shows carriers 66 at time T3 flowing from cell 2 to cell 3 while clock signal P1 is asserted.

When charge begins to flow from one cell to another shortly after clock signals change state, the clock-induced potential gradient between channel regions of adjacent cells provides a strong electric field causing carriers to drift quickly into the receiving cell. A high initial carrier concentration gradient between adjacent cells also encourages carriers to flow by diffusion. However near the end of a clock phase, as charge carriers accumulate in the receiving cell, both the carrier concentration gradient and the potential gradient between the channel regions of adjacent cells decrease. This reduces the forces on carriers that cause them to drift or diffuse into the receiving channel cell. Lateral carrier velocity begins to decline. As the frequency of clock signals applied to the electrodes of a charge-coupled device increases, the time available for all charge carriers to move from a cell to its neighbor decreases. At high clock frequencies, a substantial number of charge carriers remain behind at the end of a clock phase. FIG. 3, for example, shows two carriers 67 trapped in cell 1 at time T3.

The "charge transfer efficiency" of a charge-coupled device is the ratio of charge transferred to a CCD cell from its neighbor cell during a clock phase to the initial charge stored by its neighbor cell at the beginning of the clock cycle. As the frequency of operation of a charge-coupled device increases, charge transfer efficiency decreases because less time is available for charge movement during each clock phase. A high charge transfer efficiency is necessary, particularly in charge-coupled devices having many cells, to prevent substantial degradation of charge packets passing from cell-to-cell through the charge-coupled device. The charge transfer efficiency of a charge-coupled device therefore limits the frequency of operation of a charge-coupled device.

FIG. 4 illustrates an improved buried channel CCD cell 50 in accordance with the present invention. The CCD cell 50 is generally similar to the prior art CCD cell 50' of FIG. 2 except while the prior art cell 50' has a substantially constant dopant concentration under electrode 40b', cell 50 of the present invention has a graded dopant concentration under the corresponding electrode 40b.

Figure 5:
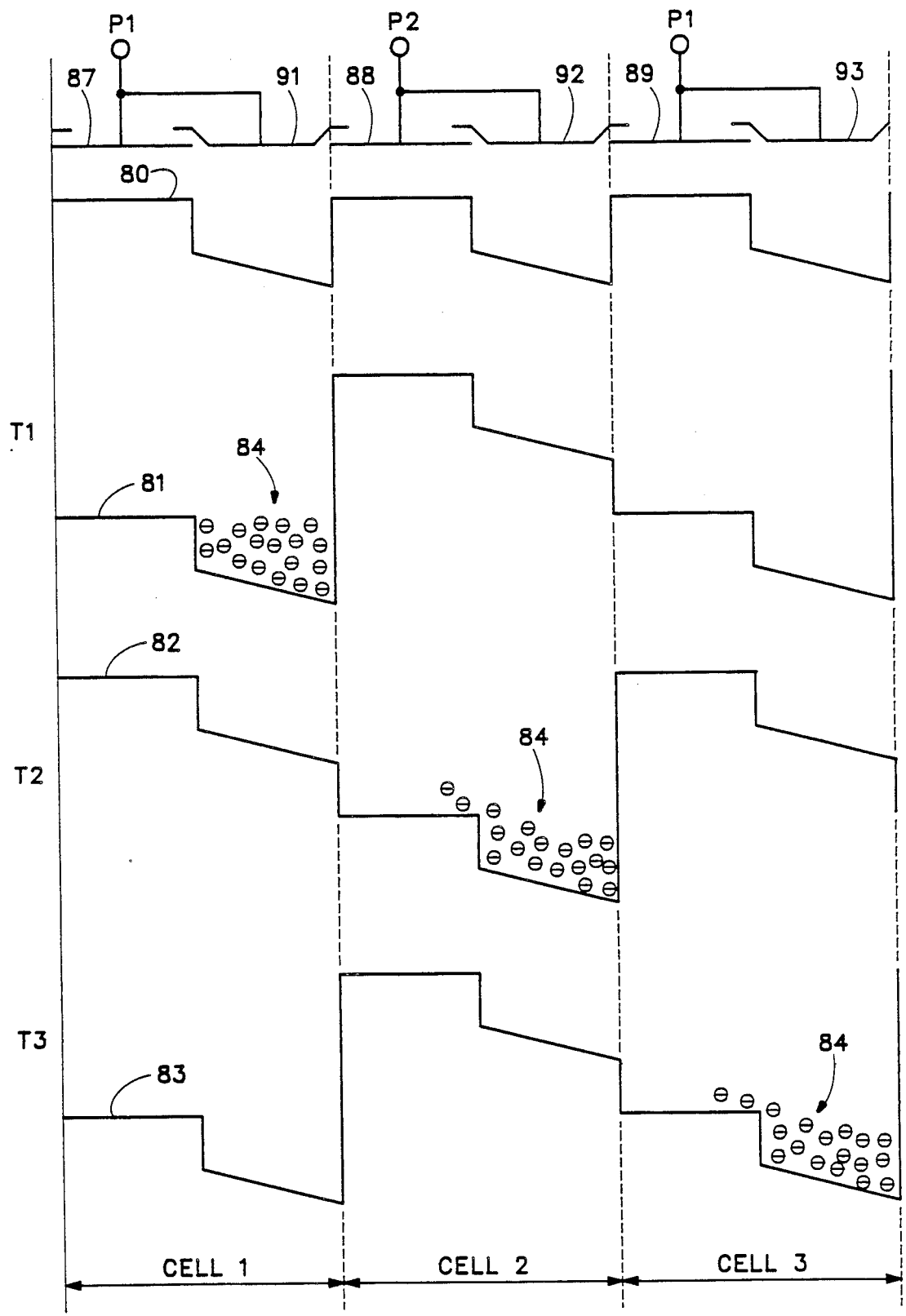
FIG. 5 is a diagram illustrating charge transfer in a two-phase, charge-coupled device formed by CCD cells similar to the cell of FIG. 4.

FIG. 5 is similar to FIG. 3 but illustrates channel potentials and charge carrier packet 84 movement through three adjacent CCD cells of FIG. 4. The built-in channel potential of the cells is illustrated by plot 80. Note that the built-in channel potential is uniformly high under the first electrode of each cell (i.e., electrodes 87–89) but relatively low and "tilted" under the other electrode of each cell (i.e., electrodes 91–93).

FIG. 5 also includes three plots 81–83 showing channel potential at times T1–T3 during lateral movement of charge packet 84 through the charge-coupled device channel in response to clock signals P1 and P2 in a manner similar to that described hereinabove with reference to FIG. 3. However, the channel region under electrodes 91–93 of cells 1, 2 and 3 of FIG. 5 have tilted potential gradients in the lateral direction and each tilted potential gradient generates an electrical field applying a lateral force on charge carriers within the channel regions under electrodes 91–93. The electric field increases carrier drift rate in the lateral direction. The increase in carrier drift rate is particularly noticeable during latter stages of a clock phase when carrier concentration and clock-induced potential gradients between neighboring cells are reduced. The additional electrical field provided by the tilted potential gradient helps to sweep the last few carriers out of a cell during latter portions a clock phase when other carrier driving forces are low. Tilting the channel potential of each cell substantially improves charge transfer efficiency at higher clock frequencies.

Figure 6:
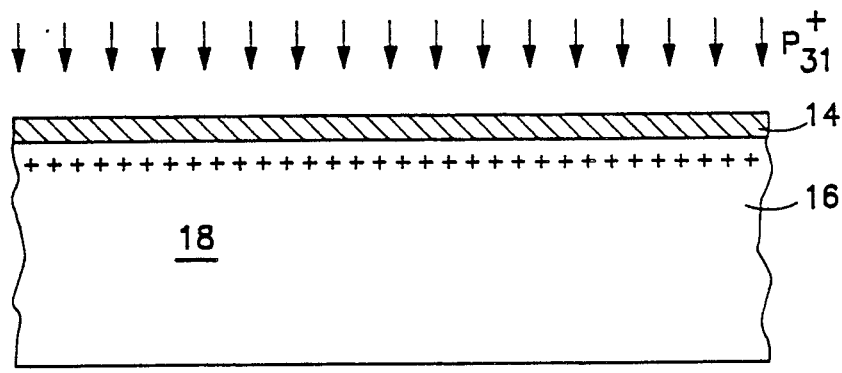
FIGS. 6–11 are sectional views illustrating various stages of fabrication of the charge-coupled device cell of FIG. 4.
Figure 7:
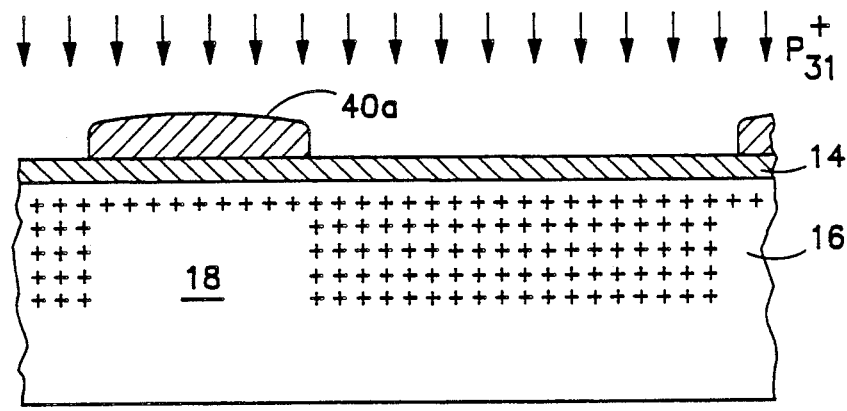
Figure 8:
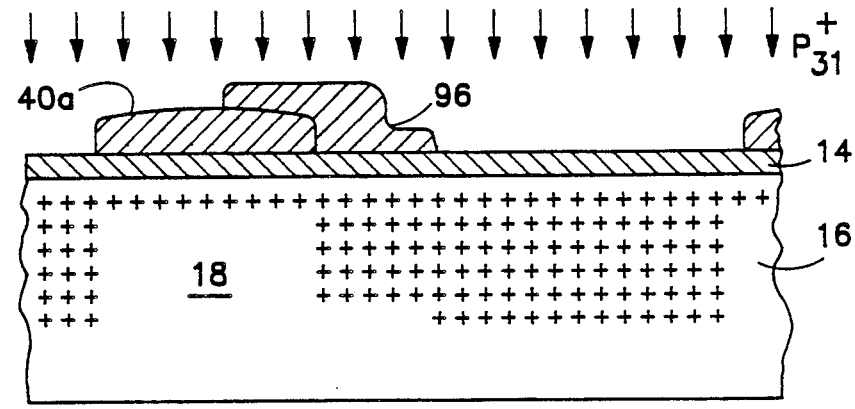
Figure 9:
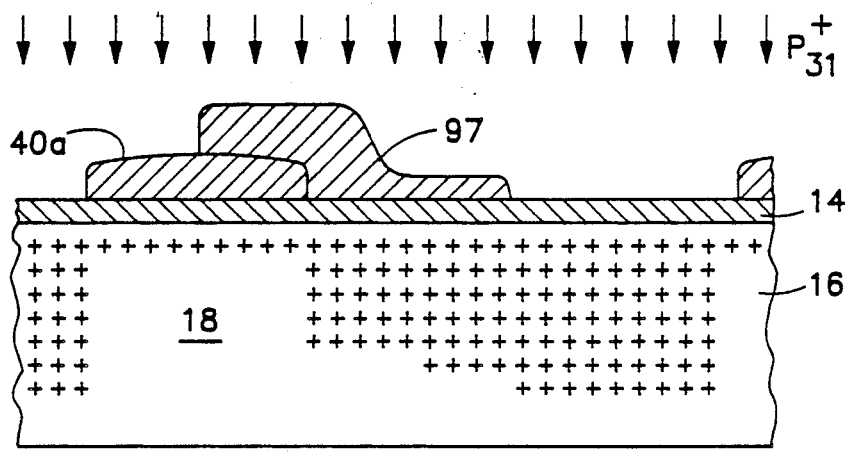
Figure 10:
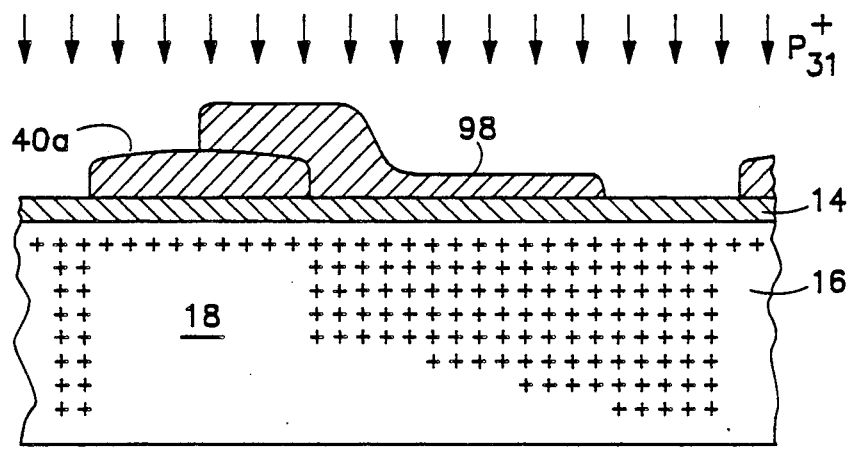

FIGS. 6–11 illustrate steps of a method for fabricating the buried channel CCD cell 50 of FIG. 4 having graded channel doping causing a tilted channel potential. The insulation layer 14 is grown on silicon substrate 16, and the channel region 18 of the p-type silicon substrate 16 is initially doped by implanting dopant ions such as $P_{31}^+$ at a controlled depth in the substrate (FIG. 6). A first polysilicon cell electrode 40a is formed on insulation layer 14 and additional dopant ions are implanted into the portion of channel region 18 not under electrode 40a. Electrode 40a acts as a self-aligned implantation mask (FIG. 7). A mask 96 formed by photolithographic technique is placed above one end of electrode 40a and above an adjacent portion of insulation layer 14. $P_{31}^+$ ions are again implanted in the substrate to increase dopant concentration in the portions of the channel not under electrode 40a or mask 96 (FIG. 8).

Figure 11:
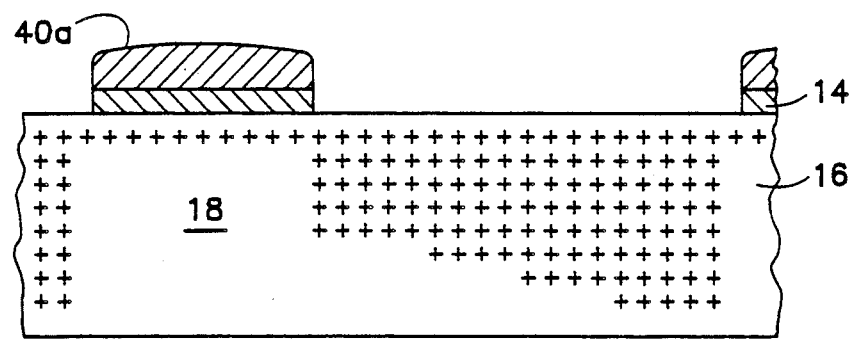

Mask 96 is then removed and replaced with a similar mask 97 (FIG. 9) laterally extending farther from electrode 40a. The dopant concentration of the portion of channel region 18 still unmasked is further increased by additional ion implantation. Mask 97 is thereafter removed and replaced with yet another mask 98 (FIG. 10), laterally extending still farther from electrode 40a. Additional ions are again implanted in unmasked portions of channel region 18. When the appropriate dopant concentration gradient in the channel has been achieved by repetitively masking and doping the substrate, the last mask and the portion of insulation layer 14 not under electrode 40a are removed (FIG. 11). The insulation layer 14 is then regrown on the exposed surface of the substrate as well as over the upper surface of electrode 40a, and an additional electrode 40b is formed on insulation layer 14 to provide the resulting cell as illustrated in FIG. 4.

While the tilted built-in channel potential may be produced by non-uniformly doping the channel as illustrated in FIGS. 6–11 in accordance with a preferred embodiment of the invention, the built-in channel potential of a CCD cell is a function not only of the dopant concentration in the channel region, but also of dopant depth, of the thickness of the channel region, of the thickness of the insulation layer between the electrode and substrate, and of the work function of the electrode. Accordingly, those skilled in the art will understand that the built-in channel potential of a cell can be tilted by grading the dopant depth in the channel region, by grading the thickness of the insulation layer, by grading the thickness of the channel region, or by providing a cell electrode having a graded work function.

Figure 12:
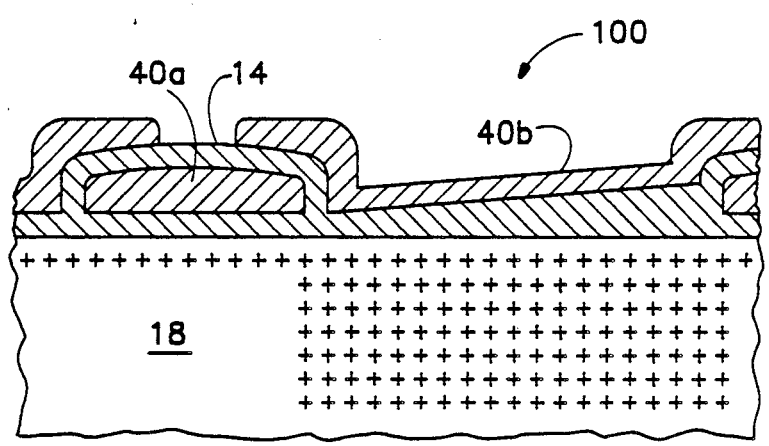
FIGS. 12 and 13 are sectional views of a single cell of a charge-coupled device in accordance with alternative embodiments of the present invention.

FIG. 12 illustrates a CCD cell 100 in accordance with an alternative embodiment of the invention wherein the built-in potential is graded under electrode 40b by grading the thickness of the insulation layer 14. The thickness of insulation layer 14 may be graded by repetitively masking and oxidizing progressively larger portions of the substrate 16 under electrode 40b before the electrode is formed.

Figure 13:
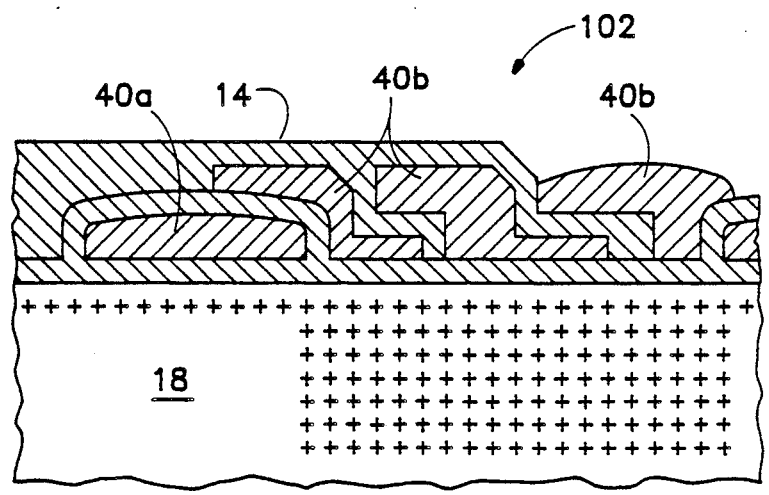

FIG. 13 illustrates a CCD cell 102 in accordance with another alternative embodiment of the invention wherein the built-in potential is graded under electrode 40b by grading the work function of electrode 40b. This may be accomplished by forming electrode 40b in several sections, each section having a different work function. The separate sections of electrode 40b along with electrode 40a are all connected to the same clock signal by a metallic layer (not shown).

A graded channel potential can also be obtained by providing graded clock signal potentials to the electrodes. For example, yet another alternative embodiment of the invention has a sectioned electrode as in FIG. 13. However, the electrode sections are not interconnected and have similar work functions. To provide a tilted channel potential, a separate clock signal is applied to each electrode 40b section, each clock signal being of the same phase but having a different voltage magnitude.

Figure 14:
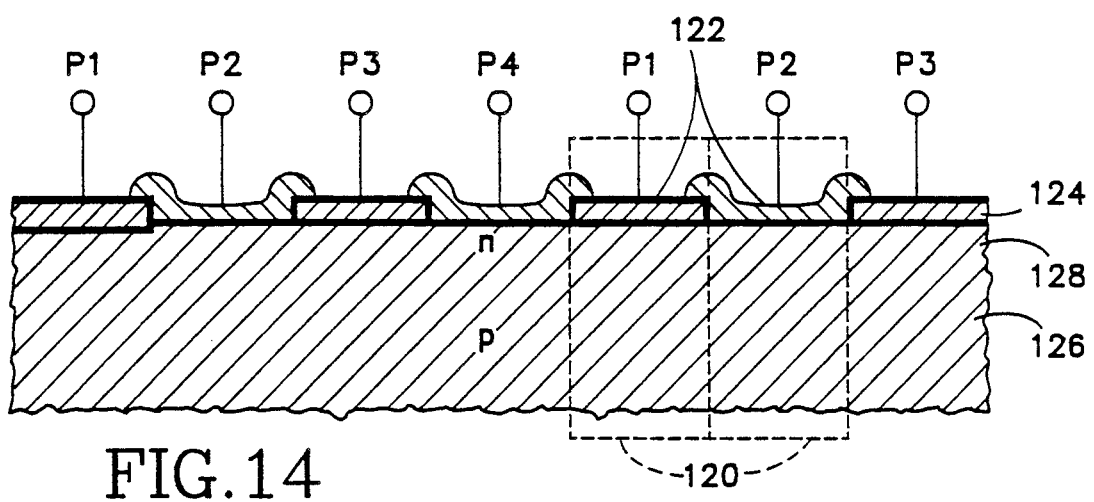
FIG. 14 is a sectional view of a portion of a four-phase, charge-coupled device.

The cell 50 of FIG. 4 is suitable for use in a two-phase, buried channel, charge-coupled device. However alternative embodiments of the invention may be employed in multiple phase charge-coupled devices employing three or more clock signal phases. For example FIG. 14 is a sectional view of a portion of a four-phase, charge-coupled device including seven cells 120. Each cell 120 includes only a single electrode 122 and the portions of insulation layer 124 and substrate 126, including a channel region 128, therebelow. Four clock signals P1-P4 applied to alternate cell electrodes are asserted sequentially.

FIG. 15 illustrates a single cell 120 in accordance with the invention suitable for use in the charge-coupled device of FIG. 14. Here the built-in potential gradient in channel region 128 is tilted throughout the entire length of the cell under electrode 122 by grading the channel dopant concentration over the entire length of the cell. The tilted channel potential gradient generates an electric field accelerating all charge carriers within the channel in the lateral direction.

Figure 16:
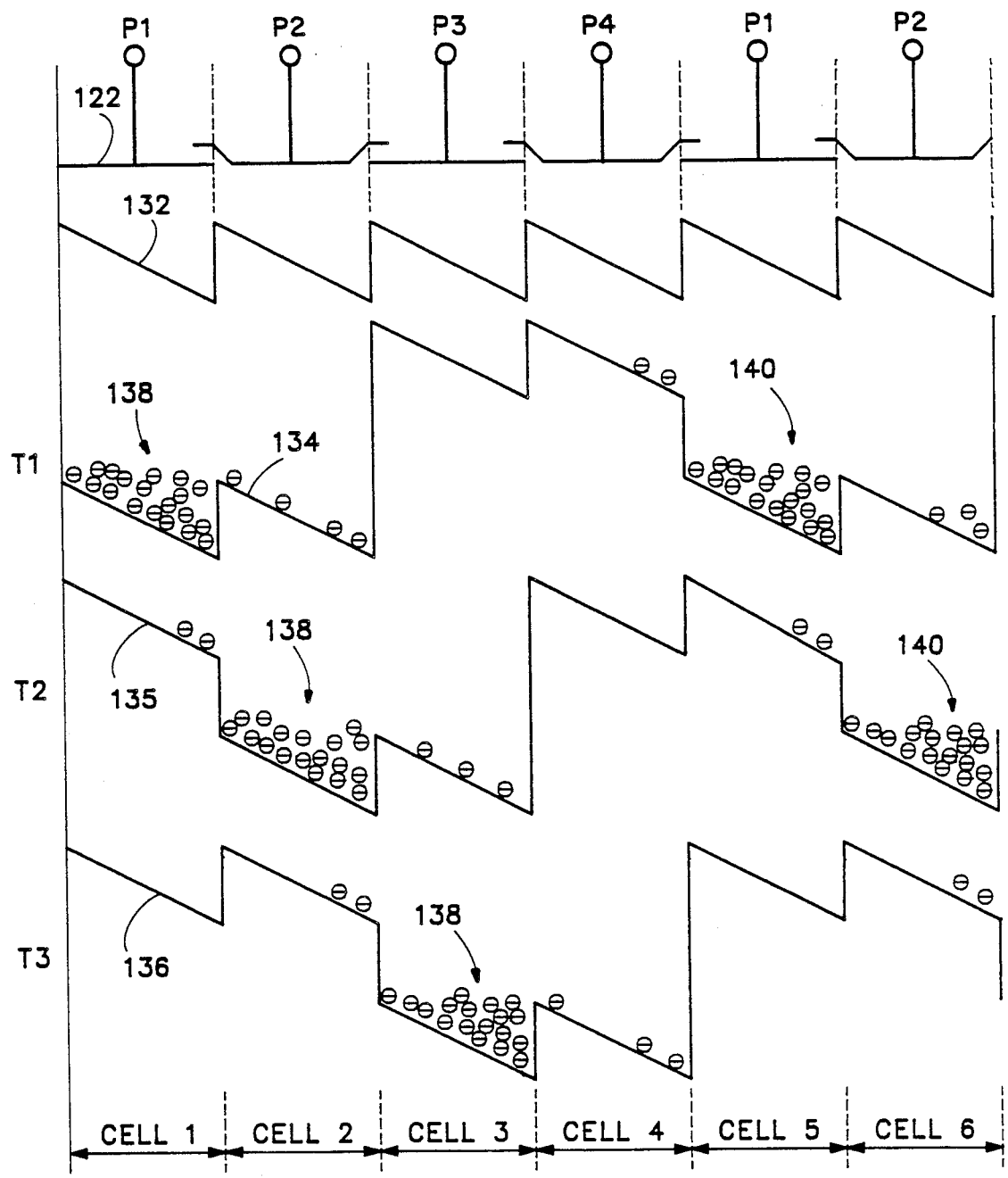
FIG. 16 is a diagram illustrating charge transfer in a four-phase, charge-coupled device formed by CCD cells similar to the cell of FIG. 15.

FIG. 16 illustrates channel potentials and charge carrier packet movement through six adjacent CCD cells similar to the cell of FIG. 15 arranged in a four-phase, charge-coupled device. The cell electrodes 122 are illustrated in diagrammatic form across the top of FIG. 16. Clock signal P1 is applied to the electrode of cells 1 and 5, clock signal P2 is applied to electrodes of cells 2 and 6, clock signal P3 is applied to the electrode of cell 3 and clock signal P4 is applied to the electrode of cell 4. The built-in channel potential of each cell 1-6 is illustrated by plot 132. Note that the built-in channel potential is tilted in the lateral direction under the full length of each electrode 122 of each cell. FIG. 16 also includes three plots 134-136 of channel potential as a function of lateral distance at times T1-T3 during movement of charge packets 138 and 140 through the charge-coupled device channel in response to clock signals P1-P4. At time T1 clock signal P1 is asserted and clock signals P2-P4 are deasserted. The channel potentials in cells 1 and 5 are low and cells 1 and 5 store charge packets 138 and 140. At time T2, after clock signal P1 is deasserted and clock signal P2 is asserted, channel potentials in cells 2 and 6 are driven low and potentials in cells 1 and 5 are high. Charge packets 138 and 140 move to cells 2 and 6. At time T3, after clock signal P2 is deasserted and clock signal P3 is asserted, channel potentials in cell 3 and cell 7 (not shown) go low, channel potentials in cells 2 and 6 rise, and charge packets 138 and 140 move to cells 3 and 7.

In charge-coupled devices of the prior art employing more than two clock phases, the channel potential gradient in each cell is flat over substantially all its length in the direction of lateral carrier flow. By tilting the channel potential gradient in each cell in accordance with the present invention, a resulting electric field applies a lateral force on charge carriers within the channel region increasing carrier drift, thereby substantially improving charge transfer efficiency particularly at a higher clock frequencies.

While preferred and alternative embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:
1. A cell for a two-phase, charge-coupled device comprising:
   a semiconductor substrate;
   an insulator layer formed above said substrate; and
   an electrode formed above said insulator layer, the substrate including a channel region of length coextensive with said electrode in one lateral direction for conducting charge carriers under said electrode,
   the channel region comprising a first portion of substantial and continuous dimension in said lateral direction having a substantially homogeneous built-in potential in said lateral direction providing minimal electric field in said lateral direction and
   the channel region further comprising a second portion of substantial and continuous dimension in said lateral direction, said second portion including substantially all of the channel region other than said first portion, said second portion having a built-in potential continuously graded in said lateral direction so as to provide an electric field for propelling charge carriers in said lateral direction, said first and second portions of said channel region being aligned in said lateral direction.

2. The cell in accordance with claim 1 wherein said channel region has a substantial built-in potential difference between said first and second portions providing an electric field propelling charge carriers in said lateral direction.

3. The cell in accordance with claim 1 wherein a potential difference between said first and second portions of said channel region provides an electric field applying a force in said lateral direction on the charge carriers between said first and second portions of said channel region.

4. The cell in accordance with claim 1 wherein said second portion of said channel region has a dopant concentration continuously graded in said lateral direction.

5. The cell in accordance with claim 1 wherein said insulator layer is of thickness graded in said lateral direction above said second portion of said channel region.

6. The cell in accordance with claim 1 wherein a work function of said electrode is graded in said lateral direction in an area laterally coextensive with said second portion of said channel region.

7. The cell in accordance with claim 1 wherein said channel region is buried substantially below a surface of said substrate.

8. A charge-coupled device comprising:
   a semiconductor substrate;
   an insulator layer formed above said substrate; and
   a plurality of electrodes formed above said insulator layer and aligned along a lateral path, the semiconductor substrate under each electrode including a channel region laterally coextensive with said electrode along said lateral path for conducting charge carriers under said electrode, the channel region under each electrode comprising a continuous first portion of substantial dimension in said lateral direction having a homogeneous built-in potential in said lateral direction providing minimal electric field in said lateral direction and the channel region under each electrode further comprising a second portion of continuous and of substantial dimension in said lateral direction, said second portion including substantially all of the channel region other than said first portion, said second portion having a built-in potential continuously graded in said lateral direction so as to provide an electric field propelling charge carriers in said lateral direction, said first and second portions of said channel region being aligned in said lateral direction.

9. The charge-coupled device in accordance with claim 8 wherein a dopant concentration in said second portion of said channel region is graded in the direction of said lateral path.

10. The cell in accordance with claim 8 wherein said channel region has a substantial built-in potential gradient between said first and second portions providing an electric field propelling charge carriers in said lateral direction.

* * * * *